(12) United States Patent
Popovic et al.

(10) Patent No.: US 7,977,862 B2
(45) Date of Patent: Jul. 12, 2011

(54) ORGANIC LIGHT EMITTING DEVICES

(75) Inventors: Zoran D. Popovic, Mississauga (CA); Hany Aziz, Oakville (CA)

(73) Assignee: LG Display Co., Ltd., Seoul (KR)

( * ) Notice: Subject to any disclaimer, the term of this patent is extended or adjusted under 35 U.S.C. 154(b) by 99 days.

(21) Appl. No.: 11/312,601

(22) Filed: Dec. 21, 2005

(65) Prior Publication Data

US 2007/0138947 A1    Jun. 21, 2007

(51) Int. Cl.
 *H01L 51/50* (2006.01)
(52) U.S. Cl. .................. 313/504; 313/506
(58) Field of Classification Search .......... 313/498–512; 428/690
See application file for complete search history.

(56) References Cited

U.S. PATENT DOCUMENTS

| | | | |
|---|---|---|---|
| 3,172,862 A | 3/1965 | Gurnee et al. |
| 3,530,325 A | 9/1970 | Mehl et al. |
| 4,356,429 A | 10/1982 | Tang |
| 4,539,507 A | 9/1985 | VanSlyke et al. |
| 4,720,432 A | 1/1988 | VanSlyke et al. |
| 4,769,292 A | 9/1988 | Tang et al. |
| 4,885,211 A | 12/1989 | Tang et al. |
| 5,141,671 A | 8/1992 | Bryan et al. |
| 5,150,006 A | 9/1992 | VanSlyke et al. |
| 5,151,629 A | 9/1992 | VanSlyke et al. |
| 5,227,252 A | 7/1993 | Murayama et al. |
| 5,247,190 A | 9/1993 | Friend et al. |
| 5,276,381 A | 1/1994 | Wakimoto et al. |
| 5,516,577 A | 5/1996 | Matsuura et al. |
| 5,593,788 A | 1/1997 | Shi et al. |
| 5,601,903 A | 2/1997 | Fujii et al. |
| 5,728,801 A | 3/1998 | Wu et al. |
| 5,846,666 A | 12/1998 | Hu et al. |
| 5,853,905 A | 12/1998 | So |
| 5,925,472 A | 7/1999 | Hu |
| 5,925,980 A | 7/1999 | So et al. |
| 5,935,720 A | 8/1999 | Chen et al. |
| 5,942,340 A | 8/1999 | Hu et al. |
| 5,952,115 A | 9/1999 | Hu et al. |
| 6,057,048 A | 5/2000 | Hu et al. |
| 6,114,055 A | 9/2000 | Choong et al. |
| 6,130,001 A | 10/2000 | Shi et al. |
| 6,229,012 B1 | 5/2001 | Hu et al. |
| 6,465,115 B2 | 10/2002 | Shi et al. |

(Continued)

FOREIGN PATENT DOCUMENTS

CN    1541035 A    10/2004

(Continued)

OTHER PUBLICATIONS

S. A. Van Slyke et al., "Organic Electroluminescent Devices with Improved Stability," Appl. Phys. Lett. 69 (15), pp. 2160-2162 (1996).

(Continued)

*Primary Examiner* — Anne M Hines
(74) *Attorney, Agent, or Firm* — McKenna Long & Aldridge LLP (57) ABSTRACT

A white organic light emitting device includes an anode; a cathode; and a light emitting region comprising one or more phosphorescent materials that emit red light, one or more phosphorescent materials that emit green light, and one or more fluorescent materials that emit blue light.

6 Claims, 3 Drawing Sheets

U.S. PATENT DOCUMENTS

| | | | |
|---|---|---|---|
| 6,479,172 | B2 | 11/2002 | Hu et al. |
| 6,562,485 | B2 | 5/2003 | Hu et al. |
| 6,565,996 | B2 | 5/2003 | Hatwar et al. |
| 6,605,317 | B1* | 8/2003 | Kathirgamanathan ........ 427/162 |
| 6,821,643 | B1 | 11/2004 | Hu |
| 2001/0053462 | A1* | 12/2001 | Mishima ....................... 428/690 |
| 2003/0178619 | A1 | 9/2003 | Forrest et al. .................... 257/40 |
| 2004/0104394 | A1* | 6/2004 | Lin et al. .......................... 257/79 |
| 2004/0115476 | A1* | 6/2004 | Oshiyama et al. ............ 428/690 |
| 2005/0123794 | A1 | 6/2005 | Deaton et al. |
| 2005/0175857 | A1 | 8/2005 | Coggan et al. |
| 2005/0221116 | A1* | 10/2005 | Cocchi et al. ................. 428/690 |

FOREIGN PATENT DOCUMENTS

| | | |
|---|---|---|
| JP | 2001-319780 | 11/2001 |
| JP | 2004-014155 | 1/2004 |
| JP | 2005-123205 | 5/2005 |
| KR | 2005-100569 A | 10/2005 |
| KR | 1020050100569 A | 10/2005 |
| WO | WO 2005/091684 A1 | 9/2005 |
| WO | WO 2005/112518 | 11/2005 |

OTHER PUBLICATIONS

Kido et al., "Organic Electroluminescent Devices Based on Molecularly Doped Polymers," Appl. Phys. Lett. 61 (7), pp. 761-763 (1992).

S. Naka et al., "Organic Electroluminescent Devices Using a Mixed Single Layer," Jpn. J. Appl. Phys. vol. 33, pp. L 1772-L1774 (1994).

W. Wen et al., "Single-Layer Organic Electroluminescent Devices by Vapor deposition Polymerization", Appl. Phys. Lett. 71 (10), pp. 1302-1304 (1997).

C. Wu et al., "Efficient Organic Electroluminescent Devices Using Single-Layer Doped Polymer Thin Films with Bipolar Carrier Transport Abilities", IEEE Transactions on Electron Devices. vol. 44, No. 8, pp. 1269-1281 (1997).

Y. Hamada et al., "Influence of the Emission Site on the Running Durability of Organic Electroluminescent Devices", Jpn. J. Appl. Phys., vol. 34, pp. L824-L826 (1995).

Bernius et al., "Proceedings of SPIE Conference on Organic Light Emitting Materials and Devices III," Denver, Colo., SPIE vol. 3797, pp. 129-137 (1999).

Baldo et. al., "Highly Efficient Organic Phosphorescent Emission from Organic Electroluminescent Devices," Letters to Nature, vol. 395, pp. 151-154 (1998).

Chihaya Adachi, et al., "High-Efficiency Red Electrophosphorescence Devices," Applied Physics Letters, vol. 78, No. 11, Mar. 12, 2001, pp. 1622-1624.

Di Marco et al., Light Emitting Diodes Based on Organic Materials, IAEA, Proceedings of a Consultants Meeting Held n Bologna, Italy, Mar. 22-25, 2004, pp. 63-69 (8-1-8-8).

\* cited by examiner

ORGANIC LIGHT EMITTING DEVICES

BACKGROUND OF THE INVENTION

1. Field of the Invention

This invention relates to optoelectronic devices, and more particularly, to organic light emitting devices (organic EL devices). More specifically, the present invention relates to efficient white organic EL devices.

2. Discussion of the Prior Art

An organic electroluminescent (EL) device or OLED can be comprised of a layer of an organic luminescent material interposed between an anode, typically comprised of a transparent conductor, such as indium tin oxide, and a cathode, typically a low work function metal such as magnesium, calcium, aluminum, or the alloys thereof with other metals. The EL device functions on the primary principle that under an electric field, positive charges (holes) and negative charges (electrons) are respectively injected from the anode and cathode into the luminescent material and undergo recombination to form excitonic states which subsequently emit light. A number of organic EL devices have been prepared from a laminate of an organic luminescent material and electrodes of opposite polarity, which devices include a single crystal material, such as single crystal anthracene as the luminescent substance as described, for example, in U.S. Pat. No. 3,530,325, the disclosure of which is completely incorporated herein by reference. These types of devices are believed to require excitation voltages on the order of 100 volts or greater.

An organic EL device with a multilayer structure can comprise one organic layer adjacent to the anode supporting hole transport, and another organic layer adjacent to the cathode supporting electron transport and acting as the organic luminescent zone of the device. Examples of these devices are disclosed in U.S. Pat. Nos. 4,356,429; 4,539,507; 4,720,432, and 4,769,292, the disclosures of which are completely incorporated herein by reference. In U.S. Pat. No. 4,769,292, the disclosure of which is completely incorporated herein by reference, an organic EL device comprises three separate layers, a hole transport layer, a luminescent layer, and an electron transport layer, which layers are laminated in sequence and are sandwiched between an anode and a cathode, and wherein a fluorescent dopant material is added to the emission zone or layer whereby the recombination of charges results in the excitation of the fluorescent material. In some of these multilayer structures, such as, for example, organic light emitting devices described in U.S. Pat. No. 4,720,432, the disclosure of which is completely incorporated herein by reference, the organic light emitting device further comprises a buffer layer interposed between the hole transport layer and the anode. The combination of the hole transport layer and the buffer layer forms a dual-layer hole transport region, reference S. A. Van Slyke et al., "Organic Electroluminescent Devices with Improved Stability," Appl. Phys. Lett. 69, pp. 2160-2162, 1996, the disclosure of which is completely incorporated herein by reference.

There have also been attempts to obtain electroluminescence from organic light emitting devices containing mixed layers, for example, layers in which both the hole transport material and the emitting electron transport material are mixed together in one single layer, such as in, for example, Kido et al., "Organic Electroluminescent Devices Based On Molecularly Doped Polymers," Appl. Phys. Lett. 61, pp. 761-763, 1992; S. Naka et al., "Organic Electroluminescent Devices Using a Mixed Single Layer," Jpn. J. Appl. Phys. 33, pp. L1772-L1774, 1994; W. Wen et al., Appl. Phys. Lett. 71, 1302 (1997); and C. Wu et al., "Efficient Organic Electroluminescent Devices Using Single-Layer Doped Polymer Thin Films with Bipolar Carrier Transport Abilities", IEEE Transactions on Electron Devices 44, pp. 1269-1281, 1997. In a number of these devices, the electron transport material and the emitting material can be the same or the mixed layer can further comprise an emitting material as a dopant. Other examples of organic light emitting devices which are formed of a single organic layer comprising a hole transport material and an electron transport material can be found, for example, in U.S. Pat. Nos. 5,853,905; 5,925,980; 6,114,055 and 6,130,001, the disclosures of which are completely incorporated herein by reference.

While recent progress in organic EL research has elevated the potential of organic EL devices for widespread applications, the operational stability of currently available devices may in some instances be below expectations. A number of known organic light emitting devices have relatively short operational lifetimes before their luminance drops to some percentage of its initial value. Providing interface layers as described, for example, in S. A. Van Slyke et al., "Organic Electroluminescent Devices with Improved Stability," Appl. Phys. Lett. 69, pp. 2160-2162, 1996, and doping as described, for example, in Y. Hamada et al., "Influence of the Emission Site on the Running Durability of Organic Electroluminescent Devices", Jpn. J. Appl. Phys. 34, pp. L824-L826, 1995, may perhaps increase the operational lifetime of organic light emitting devices for room temperature operation, however, the effectiveness of these organic light emitting devices deteriorates for high temperature device operation.

Particularly, in order to realize full-color displays, the development of OLEDs emitting in the red, green and blue regions of the visible spectrum is necessary. Although recent advances have led to the development of green and red emitting OLEDs with improved performance in commercial applications, the operational stability of blue-emitting OLEDs is still particularly unsatisfactory.

White OLEDs that utilize emitting materials of one or more colors are subject to the same drawbacks concerning efficiency and stability as color emitting OLEDs.

SUMMARY OF THE INVENTION

An exemplary embodiment of a white organic light emitting device comprises an anode; a cathode; and a light emitting region comprising one or more phosphorescent materials that emit red light, one or more phosphorescent materials that emit green light, and one or more fluorescent materials that emit blue light. In an alternate embodiment, the light emitting region comprises one or more phosphorescent materials that emit yellow and one or more fluorescent materials that emit blue light.

BRIEF DESCRIPTION OF THE DRAWINGS

Preferred embodiments of this invention will be described in detail, with reference to the following figures, in which.

DETAILED DESCRIPTION OF PREFERRED EMBODIMENTS

This invention provides organic light emitting devices (OLEDs) having improved performance, including increased efficiencies and stabilities.

Exemplary embodiments of the light emitting devices according to this invention comprise an anode, a cathode and a light emission zone between the anode and cathode. The light emission zone can comprise a wide range of different organic light emitting materials.

To avoid confusion in understanding the scope of the present invention, the following guidelines can be used:

The term "layer" indicates a single coating generally having a composition that differs from the composition of an adjacent layer;

The term "region" refers to a single layer, a plurality of layers such as two, three or more layers;

The term "zone," as used in the context of the light emitting zone, refers to a single layer, a plurality of layers, a single functional area in a layer, a plurality of functional areas in a layer, or one or more regions;

Generally, all regions and layers of the display device that are between the two electrodes or that participate in the charge conduction processes needed to operate the display device are considered part of either the cathode, luminescent zone, or anode;

Generally, a layer (e.g., substrate) that does not participate in the charge conduction processes of the display device and that can be viewed as being outside of the two electrodes shall not be considered part of the electrodes; such a layer (e.g., substrate), however, still may be considered a part of the display device; and "Light emission zone," "light emitting zone," and "luminescent zone" are used interchangeably.

Light emission from OLEDs has typically been via fluorescence, however OLED emission via phosphorescence has been recently demonstrated. As used herein, the term "phosphorescence" refers to emission from a triplet excited state of an organic molecule and the term "fluorescence" refers to emission from a singlet excited state of an organic molecule. The term luminescence refers to either fluorescent or phosphorescent emission.

One advantage of phosphorescence is that potentially all excitons formed by the recombination of holes and electrons, either as a singlet or triplet excited state, may participate in luminescence. This is because the lowest singlet excited state of an organic molecule is typically at a slightly higher energy than the lowest triplet excited state. For example, in typical phosphorescent organometallic compounds, the lowest singlet excited state may rapidly decay to the lowest triplet excited state, from which the phosphorescence is produced. In contrast, only a small percentage (about 25%) of excitons in fluorescent devices are capable of producing the fluorescent luminescence that is obtained from a singlet excited state. The remaining excitons in a fluorescent device, which are produced in the lowest triplet excited state, are typically not capable of being converted into the higher energy singlet excited states from which the fluorescence is produced. This energy, thus, becomes lost to decay processes that heat-up the device rather than emit visible light.

Typically, phosphorescent emission from organic molecules is less common than fluorescent emission. However, phosphorescence can be observed from organic molecules under an appropriate set of conditions. Organic molecules coordinated to lanthanide elements often emit from excited states localized on the lanthanide metal. Such radiative emission is not from a triplet excited state. Furthermore, such emission has not been shown to be capable of producing efficiencies high enough to be of practical value in anticipated OLED applications. The europium diketonate complexes illustrate one group of these types of species.

Organic phosphorescence may be observed in molecules containing heteroatoms with unshared pairs of electrons but, typically, only at very low temperatures. Benzophenone and 2,2'-bipyridine are such molecules. Phosphorescence can be enhanced over fluorescence at room temperature by confining, preferably through bonding, the organic molecule in close proximity to an atom of high atomic number. This phenomenon, called the heavy atom effect, is created by a mechanism known as spin-orbit coupling. A related phosphorescent transition is a metal-to-ligand charge transfer (MLCT) that is observed in molecules such as tris(2-phenylpyridine)iridium(III).

Recently, high-efficiency green and red organic electrophosphorescent devices have been demonstrated which harvest both singlet and triplet excitons, leading to internal quantum efficiencies approaching 100%. See Baldo, M. A., O'Brien, D. F., You, Y., Shoustikov, A., Sibley, S., Thompson, M. E., and Forrest, S. R., Nature (London), 395, 151-154 (1998); Baldo, M. A., Lamansky, S., Burrows, P. E., Thompson, M. E., and Forrest, S. R., Appl. Phys. Lett., 75, 4-6 (1999); Adachi, C., Baldo, M. A., and Forrest, S. R., App. Phys. Lett., 77, 904-906, (2000); Adachi, C., Lamansky, S., Baldo, M. A., Kwong, R. C., Thompson, M. E., and Forrest, S. R., App. Phys. Lett., 78, 1622-1624 (2001); and Adachi, C., Baldo, M. A., Thompson, M. E., and Forrest, S. R., Bull. Am. Phys. Soc., 46, 863 (2001). Using a green phosphorescent material, fac tris(2-phenylpyridine)iridium (Ir(ppy)3), in particular, an external quantum efficiency of (17.6±0.5) % corresponding to an internal quantum efficiency of >85%, was realized using a wide energy gap host material, 3-phenyl-4-(1'-naphthyl)-5-phenyl-1,2,4-triazole (TAZ). See Adachi, C., Baldo, M. A., Thompson, M. E., and Forrest, S. R., Bull. Am. Phys. Soc., 46, 863 (2001). More recently, high-efficiency (external quantum efficiency=(7.0±0.5) %) red electrophosphorescence was demonstrated employing bis(2-(2'-benzo[4,5-a]thienyl)pyridinato-N, C3) iridium (acetylacetonate) [Btp2 Ir(acac)]. See Adachi, C., Lamansky, S., Baldo, M. A., Kwong, R. C., Thompson, M. E., and Forrest, S. R., App. Phys. Lett., 78, 1622-1624 (2001).

In each of these latter cases, high efficiencies are obtained by energy transfer from both the host singlet and triplet states to the phosphor triplet, or via direct trapping of charge on the phosphorescent material, thereby harvesting up to 100% of the excited states. This is a significant improvement over what can be expected using fluorescence in either small molecule or polymer organic light emitting devices (OLEDs). See Baldo, M. A., O'Brien, D. F., Thompson, M. E., and Forrest, S. R., Phys. Rev., B 60, 14422-14428 (1999); Friend, R. H., Gymer, R. W., Holmes, A. B., Burroughes, J. H., Marks, R. N., Taliani, C., Bradley, D. D. C., Dos Santos, D. A., Bredas, J. L., Logdlund, M., Salaneck, W. R., Nature (London), 397, 121-128 (1999); and Cao, Y, Parker, I. D., Yu, G., Zhang, C., and Heeger, A. J., Nature (London), 397, 414-417 (1999).

The quality of white illumination sources can be fully described by a simple set of parameters. The color of the light source is given by its Commission Internationale de'Eclairage (CIE) chromaticity coordinates x and y. The CIE coordinates are typically represented on a two dimensional plot. Monochromatic colors fall on the perimeter of the horseshoe shaped curve starting with blue in the lower left, running through the colors of the spectrum in a clockwise direction to red in the lower right. The CIE coordinates of a light source of given energy and spectral shape will fall within the area of the curve. Summing light at all wavelengths uniformly gives the white or neutral point, found at the center of the diagram (CIE x,y-coordinates, 0.33, 0.33). Mixing light from two or more sources gives light whose color is represented by the intensity weighted average of the CIE coordinates of the independent sources. Thus, mixing light from two or more sources can be used to generate white light. While the two component and three component white light sources will appear identical to an observer (CIE x,y-coordinates, 0.32, 0.32), they will not be equivalent illumination sources. When considering the use of these white light sources for illumination, the CIE color rendering index (CRI) needs to be considered in addition to the CIE coordinates of the source. The CRI gives an indication of how well the light source will render colors of objects it illuminates. A perfect match of a given source to the standard illuminant gives a CRI of 100. Though a CRI value of at least 70 may be acceptable for certain applications, a preferred white light source will have a CRI of about 80 or higher.

As such, OLEDs are particularly suitable as sources of white light. The structure of light emitting fluorescence or phosphorescence additives can be tailored to emit any desired color, including white. Mixing light from two or more sources gives light whose color is determined by the weighted average of the CIE coordinates. Practically any shade of white or any temperature of white light can be generated in OLEDs. White light can be produced by mixing two or more different dyes or polymers that emit different colors in one or more layers. Other methods of producing white light can include using horizontally stacked narrow bands or pixels emitting basic colors, using monomer-excitimer complexes, and using efficient blue emitter and down-conversion phosphors.

A light emitting zone that generates white light can, for example, comprise two or more layers where at least one layer generates blue emission and at least one layer generates yellow, green, orange or red emission. The one or more layers generating blue emission can, for example, comprise one or more of the blue electroluminescent materials described herein, and the one or more layers generating the green, yellow, orange or red emission can comprise of any of the electroluminescent material capable of emission at the desired color range or by adding luminescent dopants, as those described herein, in a suitable electroluminescent material. Alternatively, a white emitting zone or region that generates white light can include a single layer of a blue electroluminescent material that further includes a green, yellow, orange, or red luminescent dopant, where the dopant allows the partial retention of blue emission from the blue electroluminescent material, which when combined with the green, yellow, orange, or red emission components from the dopant, gives the white emission. If the dopant is fluorescent material, the concentration can be, for example, 0.01% to 5% by volume, and more particularly, the concentration can be 0.2% to 2% by volume. If the dopant is a phosphorescent material, the concentration can be, for example, 0.01% to 25% by volume, and more particularly, the concentration can be 3%-15% by volume.

Figure 1:
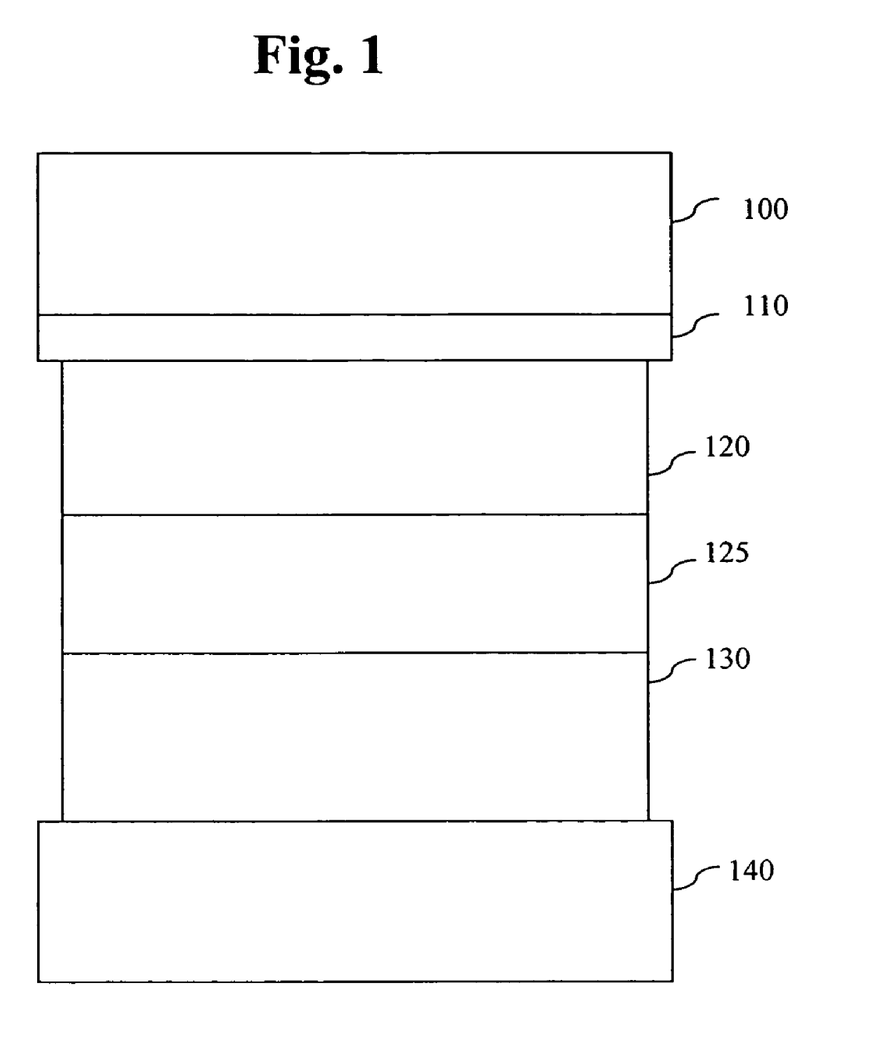
FIG. 1 illustrates an exemplary embodiment of an organic light emitting device according to the present invention.

FIG. 1 illustrates an exemplary embodiment of an organic light emitting device (OLED) 1 according to this invention. The organic light emitting device 1 comprises a substrate 100; an anode 110 adjacent the substrate 100; a hole transport region 120 adjacent the anode 110; an electron transport region 130; a cathode 140 adjacent the electron transport region 130; and a luminescent region 125 that contains one or more electron and hole transport materials. The luminescent region 125 can be one or more layers that emit red, green, and blue. In one embodiment, the red, green and blue emitter molecules are doped into a host material. Optionally, blue and yellow emitter molecules are doped into a host material.

Although the substrate 100 is shown in FIG. 1 as adjacent to the anode 110, the substrate 100 can also be positioned adjacent the cathode 140.

Figure 2:
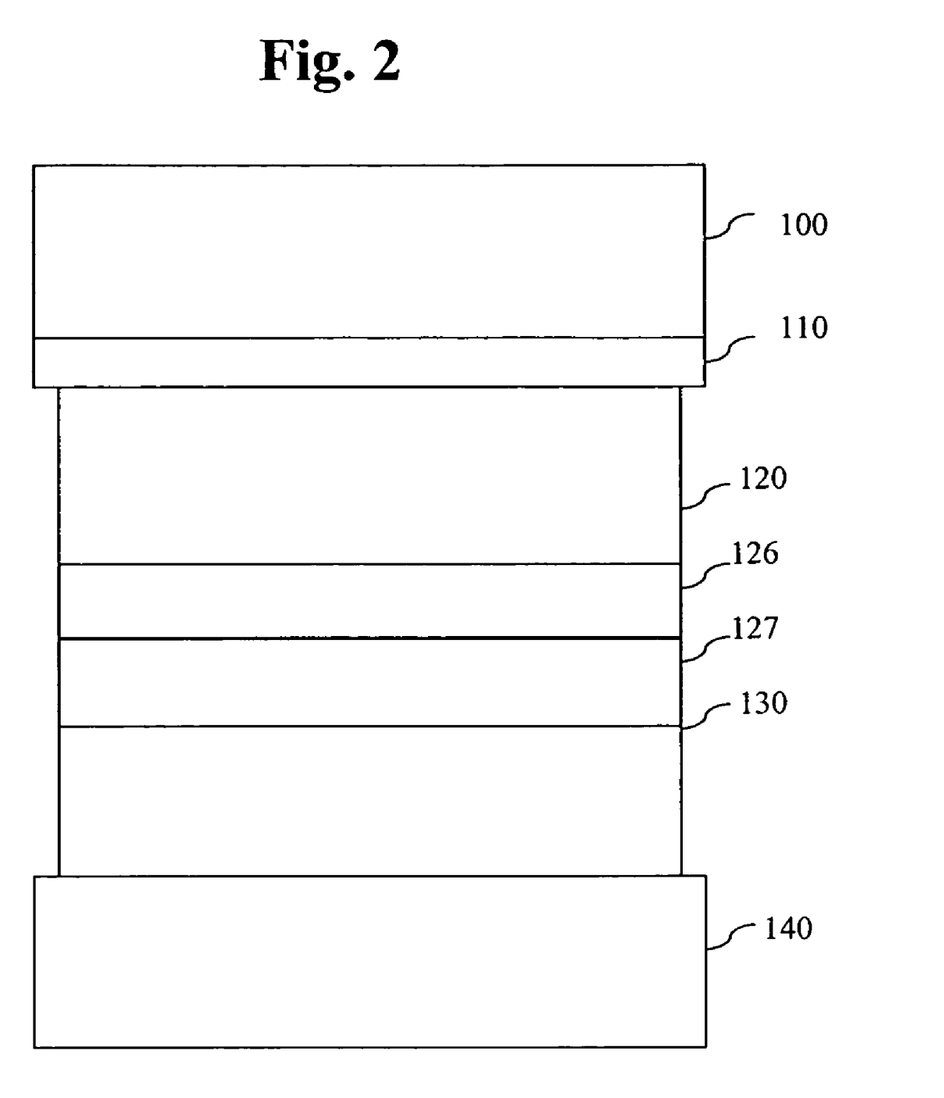
FIG. 2 illustrates another exemplary embodiment of an organic light emitting device according to the present invention.

As shown in another exemplary embodiment illustrated in FIG. 2, the luminescent region 125 is formed by one or more layers 126 that emit red and green light and one or more layers 127 that emit blue light. Optionally, layer 126 emits yellow light.

Figure 3:
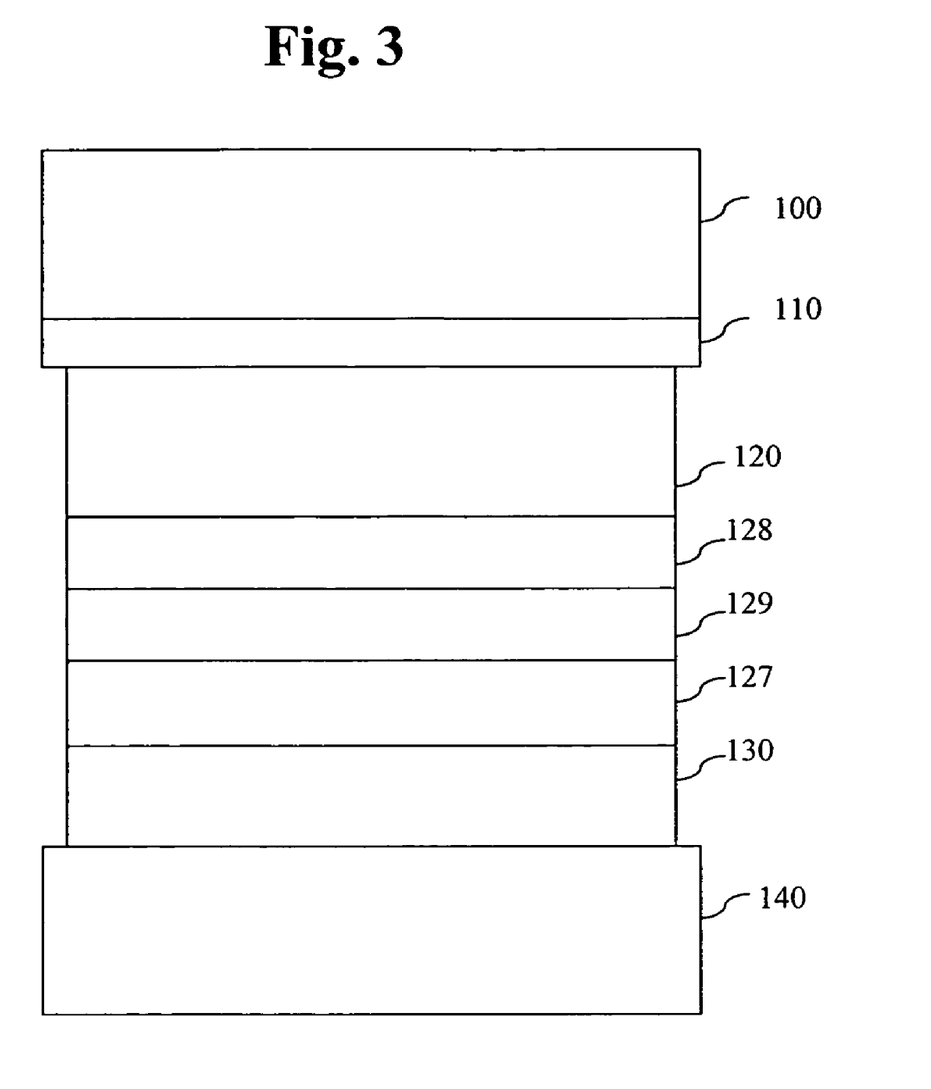
FIG. 3 illustrates another exemplary embodiment of an organic light emitting device according to the present invention.

As shown in another exemplary embodiment illustrated in FIG. 3, the luminsecent region 125 is formed by one or more layers 128 that emit red light, one or more layers 129 that emit green light, and or one or more layers 127 that emit blue light.

Generally, as discussed in more detail below, the present invention utilizes fluorescent emitters for blue emissions, and phosphorescent emitters for green, red, and yellow emissions.

In an exemplary embodiment, the fluorescent emitters and phosphorescent emitters are dopants into a suitable matrix or host material that supports the emission colors. In this manner, an OLED according to the present invention can combine the benefits of long life blue fluorescent emitters and the high efficiency and long life shown in green, red, and yellow phosphorescent emitters. Moreover, the relatively short life of blue phosphorescent emitters can be avoided, while increasing the overall efficiency of the OLED as compared with white devices using only fluorescent emitters. Examples of fluorescent and phosphorescent emitters, as well as general light emitting, hole transport and injection materials, and electron transport and injection materials are described in further details below.

Generally, the hole transport region 120, electron transport region 130, and the luminescent region 125 are collectively referred to as the light emission or luminescent zone. During operation, an applied electric field causes positive charges (holes) and negative charges (electrons) to be respectively injected into the light emitting zone from the anode 110 and the cathode 140 to recombine and thereby produce light emission in the light emission zone.

The light emission zone is comprised of an organic light emitting material. Examples of suitable organic light emitting materials can be selected, for example, from metal oxinoid compounds, stilbene compounds, anthracine compounds, oxadiazole metal chelate compounds, polyfluorenes, polyphenylenevinylenes and derivatives and mixtures thereof. Other suitable organic light emitting materials are described below.

The hole transport region 120 can include suitable hole transport materials, such as, for example, polyphenylenevinylenes, polythiophenes, tertiary aromatic amines, and indolocarbazole compounds and other materials; and suitable electron transport materials, such as, for example, metal oxinoids, triazines, oxadiazole metal chelate, stilbenes, polyfluorenes and other materials.

Various emitting materials, hole transport materials and electron transport materials are known in the art, as also is their combined selection to achieve desired color emissions. Furthermore, the selection of such materials to provide a desired color emission can be readily conducted by one of ordinary skill in the art using routine experimentation.

Embodiments of the organic light emitting devices can be operated under alternating current (AC) and/or direct current (DC) driving conditions. AC driving conditions may provide extended operational lifetimes.

The different portions of the organic light emitting devices according to this invention will now be described in greater detail.

The substrate 100 can comprise any suitable material. For example, the substrate 100 can comprise polymeric components, glass, quartz and the like. Suitable polymeric components include, but are not limited to, polyesters such as MYLAR™, polycarbonates, polyacrylates, polymethacrylates, polysulfones and the like. Mixtures of these various materials can also be used. Other substrate materials can also be provided that the materials can effectively support the other layers, and do not interfere with the device functional performance. The substrate 100 can formed of a light transmission material.

The thickness of the substrate 100 is not particularly limited except by the structural demands of the organic light emitting device and its intended use. The substrate can typically have a thickness, for example, of from about 25 μm to at least about 1,000 μm.

The anode 110 formed on the substrate 100 can comprise any suitable known or later developed material. For example, positive charge injecting electrodes such as indium tin oxide (ITO), tin oxide, gold and platinum can be used. Other suitable materials for the anode include, but are not limited to, electrically conductive carbon, π-conjugated polymers such as polyaniline, polypyrrole and the like having, for example, a work function of at least about 4 eV, and preferably from about 4 eV to about 6 eV.

The anode 110 can have any suitable structure. A thin conductive layer can be coated onto a light transmissive substrate, such as, for example, a transparent or substantially transparent glass plate or plastic film. Embodiments of the organic light emitting devices according to this invention can comprise a light transmissive anode formed from tin oxide or indium tin oxide (ITO) coated on a glass plate. Also, very thin light-transparent metallic anodes having a thickness, for example, of less than about 200 Å, and, preferably from about 75 Å to about 150 Å can be used. These thin anodes can comprise metals such as gold, palladium and the like. In addition, transparent or semi-transparent thin layers of conductive carbon or the above-mentioned conjugated polymers, having a thickness of, for example from 50 Å to about 175 Å can be used as anodes. Additional suitable forms of the anode 110 (and the cathode 140 as described in greater detail below) are disclosed in U.S. Pat. No. 4,885,211, which is incorporated herein by reference in its entirety.

The thickness of the anode 110 can range from about 1 nm to about 500 nm, with the exemplary thickness range depending on the optical constants of the anode material. One exemplary range of thickness of the anode is from about 30 nm to about 300 nm. Of course, thicknesses outside of this range can also be used.

The light emitting zone can comprise any suitable known or later developed one or more materials comprising an organic light emitting material. Suitable organic light emitting materials that can be utilized in the light emitting zone include the polyphenylenevinylenes, such as, for example, poly(p-phenylenevinylene) (PPV), poly(2-methoxy-5-(2-ethylhexyloxy)1,4-phenylenevinylene) (MEHPPV); poly(2,5-dialkoxyphenylenevinylene) (PDMeOPV), and other materials disclosed in U.S. Pat. No. 5,247,190, which is incorporated herein by reference in its entirety.

Other suitable organic light emitting materials that can be utilized in the light emitting zone include the polyphenylenes, such as, for example, poly(p-phenylene) (PPP), ladder-poly-para-phenylene (LPPP) and poly(tetrahydropyrene) (PTHP).

Still other suitable exemplary organic light emitting materials that can be utilized in the light emitting zone are the polyfluorenes, such as, for example, poly(9,9-di-n-octylfluorene-2,7-diyl), poly(2,8-(6,7,12,12-tetraalkylindenofluorene), and also copolymers containing fluorenes such as fluorene-amine copolymers, as described, for example, in Bernius et al., "Proceedings of SHE Conference on Organic Light Emitting Materials and Devices III," Denver, Colo., July 1999, Vol. 3797, p. 129, which is incorporated herein by reference in its entirety.

An exemplary class of organic light emitting materials that can be utilized in the light emitting zone includes, but is not limited to, the metal oxinoid compounds as disclosed in U.S. Pat. Nos. 4,539,507; 5,151,629; 5,150,006; 5,141,671 and 5,846,666, which are each incorporated herein by reference in their entirety. Illustrative examples include tris(8-hydroxyquinolinate) aluminum ($AlQ_3$), which is one exemplary example, and bis(8-hydroxyquinolato)-(4-phenylphenolato) aluminum (BAlQ), which is another example. Other examples of this class of materials include tris(8-hydroxyquinolinate) gallium, bis(8-hydroxyquinolinate) magnesium, bis(8-hydroxyquinolinate) zinc, tris(5-methyl-8-hydroxyquinolinate) aluminum, tris(7-propyl-8-quinolinolato) aluminum, bis[benzo{f}-8-quinolinate]zinc, bis(10-hydroxybenzo[h]quinolinate) beryllium, and the like, and metal thioxinoid compounds disclosed in U.S. Pat. No. 5,846,666, such as metal thioxinoid compounds of bis(8-quinolinethiolato)zinc, bis(8-quinolinethiolato)cadmium, tris(8-quinolinethiolato)gallium, tris(8-quinolinethiolato)indium, bis(5-methylquinolinethiolato)zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f}-8-quinolinethiolato]zinc, and the like. Exemplary materials are bis(8-quinolinethiolato)zinc, bis(8-quinolinethiolato)cadmium, tris(8-quinolinethiolato)gallium, tris(8-quinolinethiolato)indium and bis[benzo[{f}-8-quinolinethiolato]zinc.

Another exemplary class of organic light emitting materials which can be used in the light emitting zone comprises stilbene derivatives, such as those disclosed in U.S. Pat. No. 5,516,577, incorporated herein by reference in it entirety. An exemplary stilbene derivative is 4,4'-bis(2,2-diphenylvinyl) biphenyl.

Another class of suitable organic light emitting materials for forming the light emitting zone are the oxadiazole metal chelates disclosed in co-pending U.S. patent application Ser. No. 08/829,398, filed Mar. 31, 1997, and incorporated herein by reference in its entirety. These materials include bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato]beryllium; bis[5-biphenyl-2-(2-hydroxyphenyl)-1,3,4-oxadiazolato]zinc; bis[5-biphenyl-2-(2-hydroxyphenyl)-1,3,4-oxadiazolato]beryllium; bis(2-hydroxyphenyl)-5-phenyl-1,3,4-oxadiazolato]lithium; bis[2-(2-hydroxyphenyl)-5-p-tolyl-1,3,4-oxadiazolato]zinc; bis[2-(2-hydroxyphenyl)-5-p-tolyl-1,3,4-oxadiazolato]beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato]zinc; bis[2-(2-hydroxyphenyl)-5-(4-fluorophenyl)-1,3,4-oxadiazolato]zinc; bis[2-(2-hydroxyphenyl)-5-(4-fluorophenyl)-1,3,4-oxadiazolato]beryllium; bis[5-(4-chlorophenyl)-2-(2-hydroxyphenyl)-1,3,4-oxadiazolato]zinc; bis[2-(2-hydroxyphenyl)-5-(4-methoxyphenyl)-1,3,4-oxadiazolato]zinc; bis[2-(2-hydroxy-4-methylphenyl)-5-phenyl-1,3,4-oxadiazolato]zinc; bis[2-.alpha.-(2-hydroxynaphthyl)-5-phenyl-1,3,4-oxadiazolato]zinc; bis[2-(2-hydroxyphenyl)-5-p-pyridyl-1,3,4-oxadiazolato]zinc; bis[2-(2-hydroxyphenyl)-5-p-pyridyl-1,3,4-oxadiazolato]beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato]beryllium; bis[2-(2-hydroxyphenyl)-5-(1-naphthyl)-1,3,4-thiadiazolato]zinc; bis[2-(2-hydroxyphenyl)-5-(1-naphthyl)-1,3,4-thiadiazolato]beryllium, and the like.

Another class of suitable organic light emitting materials that can be utilized in the light emitting zone are the triazines, as disclosed in U.S. Pat. No. 6,057,048 and co-pending U.S. patent application Ser. No. 09/489,144, filed Jan. 21, 2000, which are each incorporated herein by reference in their entirety.

Another class of suitable organic light emitting materials that can be utilized in the light emitting zone are the anthracenes.

Other examples of organic light emitting materials that can be utilized in the light emitting zone are fluorescent materials, such as, for example, coumarin, dicyanomethylene pyranes, polymethine, oxabenzanthrane, xanthene, pyrylium, carbostyl, perylene, and the like. Another specially exemplary class of fluorescent materials are the quinacridone dyes. Illustrative examples of quinacridone dyes include quinacridone, 2-methylquinacridone, 2,9-dimethylquinacridone; 2-chloroquinacridone; 2-fluoroquinacridone; 1,2-benzoquinacridone; N,N'-dimethylquinacridone; N,N'-dimethyl-2-methylquinacridone; N,N'-dimethyl-2,9-dimethylquinacridone; N,N'-dimethyl-2-chloroquinacridone; N,N'-dimethyl-2-fluoroquinacridone; N,N'-dimethyl-1,2-benzoquinacridone, and the like, as disclosed in U.S. Pat. Nos. 5,227,252; 5,276,381 and 5,593,788, which are each incorporated herein in their entirety. Another exemplary class of fluorescent materials are fused ring fluorescent dyes. Examples of the fused ring fluorescent dyes include perylene, rubrene, anthracene, coronene, phenanthrecene, pyrene, and the like, as illustrated in U.S. Pat. No. 3,172,862, which is incorporated herein by reference in its entirety. Also, fluorescent materials include butadienes, such as, 1,4-diphenylbutadiene and tetraphenylbutadiene, stilbenes, and the like, as disclosed in U.S. Pat. Nos. 4,356,429 and 5,516,577, which are each incorporated herein by reference in their entirety. Other exemplary fluorescent materials that can be used are disclosed in U.S. Pat. No. 5,601,903, which is incorporated herein by reference in its entirety.

Another exemplary class of organic light emitting materials that can be utilized in the light emitting zone are fluorescent dyes, as disclosed in U.S. Pat. No. 5,935,720, which is incorporated herein by reference in its entirety. Exemplary materials include, for example, 4-(dicyanomethylene)-2-1-propyl-6-(1,1,7,7-tetramethyljulolidyl-9-enyl)-4H-pyran (DCJTB).

Another exemplary class of organic light emitting materials that can be utilized in the light emitting zone are lanthanide metal chelate complexes, such as, for example, tris(acetylacetonato)(phenanthroline) terbium, tris(acetyl acetonato)(phenanthroline) europium, and tris(thenoyl trisfluoroacetonato)(phenanthroline) europium, as disclosed in Kido et al., "White Light Emitting Organic Electroluminescent Device Using Lanthanide Complexes," Jpn. J. Appl. Phys., Vol. 35, pp. L394-L396 (1996), which is incorporated herein by reference in its entirety.

Another exemplary class of organic light emitting materials that can be utilized in the light emitting zone are the phosphorescent materials, such as, for example, organometallic compounds containing heavy metal atoms that lead to strong spin-orbit coupling, such as those compounds disclosed in Baldo et. al., "Highly Efficient Organic Phosphorescent Emission from Organic Electroluminescent Devices," Letters to Nature, Vol. 395, pp 151-154 (1998). Examples include 2,3,7,8,12,13,17,18-octaethyl-21H23H-phorpine platinum(II) (PtOEP) and fac tris(2-phenylpyridine)iridium (Ir(ppy)$_3$).

Without limitation on the usefulness of the organic light emitting materials discussed herein, a blue organic light emitting material may be for example a polyfluorene, an anthracene derivative, such as those described, for example in U.S. Pat. No. 6,479,172, U.S. Pat. No. 6,562,485, U.S. Pat. No. 6,465,115, and U.S. Pat. No. 6,565,996, like 9,10-diphenylanthracene ("DPA"), 9, 10-bis[4-2,2-diphenylethenyl)phyenyl]anthracene ("ADN"), and tertiary-butyl substituted 9, 10-bis[4-(2,2-diphenylethenyl)phenyl]anthracene ("TBADN" also sometimes given the acronym "BH2"), a stilbene derivative such as those described above, a triazine derivative, such as those described in U.S. Pat. No. 6,229,012, a carbazole derivative including bicarbozole derivatives, or a binaphtyl derivative, such as those described in U.S. application Ser. No. 10/774,577, filed Feb. 10, 2004. These disclosures of the cited patents and applications are fully incorporated herein by reference.

Without limitation on the usefulness of the organic light emitting materials discussed herein, a red organic light emitting material may be for example a polyfluorene, such as those mentioned above, a polyphenylene vinylene, such as MeHPPV, or others as described herein. In exemplary embodiments, certain red emitting devices utilize an electroluminescent material that by itself would emit green or blue light, but is doped with one or more red luminescent materials.

Without limitation on the usefulness of the organic light emitting materials discussed herein, a green organic light emitting material may be a polyfluorene, as those described above, a polyphenylene vinylene as those described herein, or a metal chelate such as AlQ$_3$, or others as described herein. In exemplary embodiments, certain green emitting devices utilize an electroluminescent material that by itself would emit blue light, but is doped with one or more green luminescent materials.

The hole transport material that can be utilized in the present invention can be any suitable known or later developed material.

Exemplary hole-transporting materials include polypyrrole, polyaniline, poly(phenylene vinylene), polythiophene, polyarylamine (which are disclosed in U.S. Pat. No. 5,728,801, incorporated herein by reference in its entirety) and their derivatives, and known semiconductive organic materials; porphyrin derivatives such as 1,10,15,20-tetraphenyl-21H, 23H-porphyrin copper (II) disclosed in U.S. Pat. No. 4,356,429, incorporated herein by reference in its entirety; copper phthalocyanine, copper tetramethyl phthalocyanine, zinc phthalocyanine, titanium oxide phthalocyanine, magnesium phthalocyanine and the like.

An exemplary class of hole transporting materials that can be utilized are the aromatic tertiary amines such as those disclosed in U.S. Pat. No. 4,539,507, which is incorporated herein by reference in its entirety. Suitable exemplary aromatic tertiary amines include, for example, bis(4-dimethylamino-2-methylphenyl)phenylmethane; N,N,N-tri(p-tolyl)amine; 1,1-bis(4-di-p-tolylaminophenyl)cyclohexane; 1,1-bis(4-di-p-tolylaminophenyl)-4-phenyl cyclohexane; N,N'-diphenyl-N,N'-bis(3-methylphenyl)-1,1-biphenyl-4,4'-diamine; N,N'-diphenyl-N,N'-bis(3-methylphenyl)-1,1'-biphenyl-4,4'-diamine; N,N'-diphenyl-N,N'-bis(4-methoxyphenyl)-1,1'-biphenyl-4,4'-diamine, N,N,N',N'-tetra-p-tolyl-1,1'-biphenyl-4,4'-diamine; N,N'-di-1-naphthyl-N,N'-diphenyl-1,1'-biphenyl-4,4'-diamine; mixtures thereof and the like.

Another class of aromatic tertiary amines that can be utilized is the polynuclear aromatic amines. Examples of such polynuclear aromatic amines include, for example, N,N-bis-[4'-(N-phenyl-N-m-tolylamino)-4-biphenylyl]aniline; N,N-bis-[4'-(N-phenyl-N-m-tolylamino)-4-biphenylyl]-m-toluidine; N,N-bis-[4'-(N-phenyl-N-m-tolylamino)-4- biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, mixtures thereof and the like.

Another class of hole transporting materials that can be utilized is comprised of 4,4'-bis(9-carbazolyl)-1,1'-biphenyl compounds, such as, for example, 4,4'-bis(9-carbazolyl)-1,1'-biphenyl; 4,4'-bis(3-methyl-9-carbazolyl)-1,1'-biphenyl, and the like.

An exemplary class of the hole transporting materials that can be utilized is the indolo-carabazoles, such as those disclosed in U.S. Pat. Nos. 5,942,340 and 5,952,115, which are incorporated herein by reference in their entirety.

Another exemplary class of hole transporting materials that can be utilized is comprised of N,N,N'N'-tetraarylbenzidines, wherein aryl may be selected from phenyl, m-tolyl, p-tolyl, m-methoxyphenyl, p-methoxyphenyl, 1-naphthyl, 2-naphthyl and the like. Illustrative examples of N,N,N'N'-tetraarylbenzidine are N,N'-di-1-naphthyl-N,N'-diphenyl-1,1'-biphenyl-4,4'-diamine, which is more exemplary; N,N'-bis(3-methylphenyl)-N,N'-diphenyl-1,1'-biphenyl-4,4'-diamine; N,N'-bis(3-methoxyphenyl)-N,N'-diphenyl-1,1'-biphenyl-4,4'-diamine, and the like.

Exemplary hole transporting materials that can be utilized are the naphtyl-substituted benzidine derivatives.

Examples of electron transport material that can be utilized can be selected from metal oxinoid compounds, the oxadiazole metal chelate compounds, the triazine compounds and the stilbene compounds, examples of which are described above.

Other examples of electron transport material that can be utilized are the polyfluorenes, such as poly(9,9-di-n-octylfluorene-2,7-diyl), poly(2,8-(6,7,12,12-tetraalkylindenofluorene) and copolymers containing fluorenes such as fluorene-amine copolymers. See, for example, Bernius et al., "Proceedings of SPIE Conference on Organic Light Emitting Materials and Devices III," Denver, Colo., July 1999, Vol. 3797, p. 129.

The luminescent region can be can be formed using mixtures of any of the suitable exemplary hole transport materials and electron transport materials described herein, including the materials used to form the hole transport and electron transport layers.

The one or more layers comprising the light emission zone can be prepared by forming one of the above-described materials into thin films by any suitable known or later developed method. Suitable methods for this purpose include, for example, vapor deposition and spin-coating techniques.

The light emission zone can have a thickness ranging from about 10 nm to about 1000 nm. Preferably, this thickness is from about 50 nm to about 250 nm. In embodiments in which the light emission region is comprised of one or more adjacent layers, the thickness of the individual layers can be at least about 5 nm.

The cathode 140 can comprise any suitable metal, including high work function components, having a work function, for example, from about 4.0 eV to about 6.0 eV, or low work function components, such as metals with, for example, a work function of from about 2.5 eV to about 4.0 eV. The cathode can comprise a combination of a low work function (less than about 4 eV) metal and at least one other metal. Effective proportions of the low work function metal to the second or other metal are from less than about 0.1 wt. % to about 99.9 wt. %. Illustrative examples of low work function metals include, but are not limited to, alkaline metals such as lithium or sodium; Group 2A or alkaline earth metals such as beryllium, magnesium, calcium or barium; and Group III metals including rare earth metals and the actinide group metals such as scandium, yttrium, lanthanum, cerium, europium, terbium or actinium. Lithium, magnesium and calcium are exemplary low work function metals.

The Mg—Ag alloy cathodes of U.S. Pat. No. 4,885,211 are one exemplary cathode construction. Another exemplary cathode construction is described in U.S. Pat. No. 5,429,884, wherein the cathodes are formed from lithium alloys with other high work function metals such as aluminum and indium. These patents are incorporated herein by reference in their entirety.

The thickness of the cathode 140 can range from, for example, about 10 nm to about 500 nm. Of course, thicknesses outside of this range can also be used.

Examples of fluorescent molecules and metal complexes used as emitting and electron transporting materials are listed below:

Alq$_3$

Bebq$_2$

Znq$_2$

PBD

TSO2hex

TAZ

Examples of phosphorescent dopants are listed below:

Ir (ppy)₃

PtOEP

Pt(tpy)₂

Eu(DBM)₃phen

Examples of fluorescent dopants are listed below:

perylene derivatives coumarin C-545T b-DNA

The following US patent applications that are commonly owned by the assignee of the present invention can be utilized with the present invention, and are incorporated herein by reference in their entirety: Ser. Nos. 10/909,691; 10/909,689; 10/372,547; 10/702,857; 10/401,238; 11/006,000; 10/774,577; 11/133,977; 11/133,978; 11/133,975; 11/133,752;

11/122,290; 11/122,288; 11/133,753; 11/122,290; 11/122,288; 11/133,753; 11/184,775; and 11/184,776.

Moreover, each of the aforementioned patents, articles, and references mentioned herein are incorporated by reference in their entirety.

While the invention has been described in conjunction with the specific embodiments described above, it is evident that many alternatives, modifications and variations are apparent to those skilled in the art. Accordingly, the preferred embodiments of the invention as set forth above are intended to be illustrative and not limiting. Various changes can be made without departing from the spirit and scope of the invention.

The invention claimed is:

1. A white organic light emitting device, comprising:
   an anode;
   a cathode; and
   a light emitting region comprising a layer of blue electroluminescent material, the layer consisting essentially of one or more fluorescent materials that emit blue light and doped with one or more phosphorescent materials that emit red light, and with one or more phosphorescent materials that emit green light;
   wherein the concentration of the one or more fluorescent materials is 2% by volume;
   wherein the phosphorescent materials that emit red light allow the partial retention of blue emission from the fluorescent materials; and
   wherein the phosphorescent materials that emit green light allow the partial retention of blue emission from the fluorescent materials.

2. The device of claim 1, wherein the phosphorescent materials that emit red light, or the phosphorescent materials that emit green light is doped to a concentration of 0.01% to 25% by volume.

3. The device of claim 1, wherein the phosphorescent materials that emit red light is:

Eu(DBM)₃phen and
   wherein the phosphorescent materials that emit green light is:

Ir (ppy)₃

4. A white organic light emitting device, comprising:
   an anode;
   a cathode; and
   a light emitting region comprising a layer of blue electroluminescent material, the layer consisting essentially of one or more fluorescent materials that emit blue light doped with one or more phosphorescent materials that emit yellow light;
   wherein the concentration of the one or more fluorescent materials is 2% by volume; and
   wherein the phosphorescent materials that emit yellow light allow the partial retention of blue emission from the fluorescent materials.

5. The device of claim 4, wherein the phosphorescent materials that emit yellow light is doped to a concentration of 0.01% to 25% by volume.

6. The device of claim 4, wherein the phosphorescent materials that emit yellow light is:

Pt(tpy)₂

* * * * *